United States Patent
Kamei et al.

(10) Patent No.: US 7,093,268 B2
(45) Date of Patent: Aug. 15, 2006

(54) FLEXIBLE WIRING PLATE AND AN ELECTRONIC DEVICE FOR RECORDING AND/OR PLAYING BACK INFORMATION USING THE FLEXIBLE WIRING PLATE

(75) Inventors: Yo Kamei, Kokubunji (JP); Naotaka Sekita, Tokorozawa (JP)

(73) Assignee: Teac Corporation, Tokyo (JP)

( * ) Notice: Subject to any disclaimer, the term of this patent is extended or adjusted under 35 U.S.C. 154(b) by 474 days.

(21) Appl. No.: 10/234,542

(22) Filed: Sep. 3, 2002

(65) Prior Publication Data
US 2003/0045177 A1    Mar. 6, 2003

(30) Foreign Application Priority Data

Sep. 4, 2001   (JP)   ............... 2001-267760
Apr. 8, 2002   (JP)   ............... 2002-105678

(51) Int. Cl.
*G11B 17/03*   (2006.01)
(52) U.S. Cl. .................................... 720/601
(58) Field of Classification Search .. 360/245.1–245.9; 369/75.21, 75.11, 77.21, 77.11, 116, 270, 369/219; 720/600, 601, 610, 604, 673
See application file for complete search history.

(56) References Cited

U.S. PATENT DOCUMENTS 6,151,284 A * 11/2000 Watanabe et al. ........... 720/601
6,160,780 A * 12/2000 Furukawa et al. ........... 720/604
6,603,723 B1 * 8/2003 Minase ....................... 720/673
2001/0004347 A1 * 6/2001 Koga et al. .................. 369/116
2001/0036145 A1 * 11/2001 Otani et al. .................. 369/219
2002/0018426 A1 * 2/2002 Minase ....................... 369/75.2
2003/0193787 A1 * 10/2003 Manabe et al. .............. 361/752
2003/0202447 A1 * 10/2003 Watanabe et al. ........... 369/75.2
2004/0117807 A1 * 6/2004 Takahashi et al. ........... 720/610
2004/0205785 A1 * 10/2004 Takahashi et al. ........... 720/601
2004/0233799 A1 * 11/2004 Takahashi et al. ........ 369/30.36

FOREIGN PATENT DOCUMENTS

| JP | 06-338185 | 12/1994 |
| JP | 11-144403 | 5/1999 |
| JP | 2000-339946 | 12/2000 |

\* cited by examiner

*Primary Examiner*—Allen Cao
(74) *Attorney, Agent, or Firm*—Anderson Kill & Olick, P.C.; Eugene Lieberstein; Michael N. Meller

(57) ABSTRACT

A flexible wiring plate includes a first wiring plate connected to a connector of a member of a fixed side (chassis), a second wiring plate connected to a connector of a member of a movable side (slide), and a third wiring plate connecting the first wiring plate to the second wiring plate, wherein an extended direction of the first wiring plate is parallel to the second wiring plate, the second wiring plate is curved so as to be able to bend in an opposite direction to the extended direction of the first wiring plate when the flexible wiring plate is provided, and a reinforcement part having an increased width is formed at a facing part of the second wiring plate that faces a gap formed between the member of the fixed side and the member of the movable side.

6 Claims, 14 Drawing Sheets

FLEXIBLE WIRING PLATE AND AN ELECTRONIC DEVICE FOR RECORDING AND/OR PLAYING BACK INFORMATION USING THE FLEXIBLE WIRING PLATE

BACKGROUND OF THE INVENTION

1. Field of the Invention

The present invention generally relates to flexible wiring plates and electronic devices for recording and/or playing back information using the flexible wiring plates, and more particularly, to a flexible wiring plate and an electronic device for recording and/or playing back information using the flexible wiring plate, which is provided so as to curve and connect a fixed side and a movable side, so that the curved part moves as corresponding to movement of the moveable side.

2. Description of the Related Art

A recording medium, for example a disk type recording medium (hereinafter "disk") such as a CD-ROM, CD-R, CD-RW, DVD-ROM, DVD-RAM or the like, is provided in a disk device. It is demanded by users that notebook type personal computers in which the disk device is incorporated be made miniaturized and thinner. As a result, making the disk device itself thinner has been attempted. Thereby, space formed between a tray on which the disk is placed and a chassis that slideably supports the tray becomes narrower.

A turntable and an optical pick up are provided in the tray. The turntable rotationally drives the disk. The optical pick up irradiates a laser beam on a surface of the disk held by the turntable so that information recorded in the disk is read out. A substrate is provided inside of the chassis of the disk device. The tray as a movable side and the substrate provided inside of the chassis as a fixed side are connected by a flexible wiring plate.

Furthermore, the flexible wiring plate is formed so as to have a rectangular shape but not having one side of a plane configuration. A first end part of the flexible wiring plate is connected to a connector equipped at the substrate that is provided inside of the chassis. A second end part of the flexible wiring plate is curved so as to extend in an opposite direction to the extending direction of the first end part, so that the second end part of the flexible wiring plate is connected to the connector provided at the tray. Because of this, the curved part of the flexible wiring plate moves as corresponding to the movement of the tray, and thereby it is assured to move with the tray.

FIG. 1-(A) and 1-(B) show a disk device 102 in the related art. As shown in FIG. 1-(A), in a tray 106, which is included in the disk device 102, a turntable 134 on which the disk is placed and which rotates the disk, a pickup portion (not shown in FIG. 1-(A) and FIG. 1-(B)) that optically detects information recorded on the disk and so forth are provided.

A flexible wiring plate 110 is provided between the tray 106 and a chassis 104. The flexible wiring plate 110 is curved in accordance with a position relationship between the tray 106 and the chassis 104. Further, the flexible wiring plate 110 electrically connects a substrate 138 provided in the tray 106 with a substrate 140 provided in the chassis 104. When the tray 106 moves, a curved portion 110a follows the sliding movement of the tray 106 and moves in the chassis 104.

As shown in FIG. 1-(B), as a result of the disk device 102 becoming thinner, the inner space of the chassis 104 becomes narrow, and, thereby the flexible wiring plate cannot bend gradually. Accordingly, when the tray 106 is received by the chassis 104, the curved portion 110a of the flexible wiring plate 110 may come into contact with a ceiling plate 104a of the chassis 104. In this case, due to the frictional resistance occurring as a result of the contact of the curved portion 110a with the ceiling plate 104a of the chassis 104, the curved portion 110a does not slide so that the flexible wiring plate 110 is stopped from entering the chassis 104 and a portion 110b of the flexible wiring plate 110, which portion 110b cannot enter the chassis 104, projects from the gap between the tray 106 and the chassis 104.

Further, when the tray 106 continues to move into the chassis 104, the projecting portion 110b of the flexible wiring plate 110 is sandwiched between a rear end portion 106a of the tray 106 and a front end portion 104b of the chassis 104.

SUMMARY OF THE INVENTION

Accordingly, it is a general object of the present invention is to provide a novel and useful flexible wiring plate and electronic device for recording and/or playing back information using the flexible wiring plate in which the problems described above are eliminated.

Another and more specific object of the present invention is to provide a flexible wiring plate and an electronic device for recording and/or playing back information using the flexible wiring plate so as to prevent a portion of the flexible wiring plate from projecting from a gap between the tray and the chassis when the tray is received to the chassis.

The above object of the present invention is achieved by a flexible wiring plate, including a first wiring plate connected to a connector of a member of a fixed side; a second wiring plate connected to a connector of a member of a movable side; and a third wiring plate connecting the first wiring plate to the second wiring plate; wherein an extended direction of the first wiring plate is parallel to the second wiring plate; the second wiring plate is curved so as to be able to bend in an opposite direction to the extended direction of the first extended when the flexible wiring plate is provided; and a reinforcement part having a wide width is formed at a facing part of the second wiring plate which faces a gap formed between the member of the fixed side and the member of the movable side.

According to the above object of the present invention, rigidity of the facing part of the second wiring plate is improved so that the flexible wiring plate is prevented from projecting into the gap formed between the members of movable side and the fixed side. Hence, the flexible wiring plate being sandwiched by the members of movable side and the fixed side so that the member of movable side does not move smoothly and accurately can be avoided.

The above object of the present invention is also achieved by a flexible wiring plate, including a first wiring plate connected to a connector of a member of a fixed side; a second wiring plate connected to a connector of a member of a movable side; and a third wiring plate connecting the first wiring plate to the second wiring plate; wherein an extended direction of the first wiring plate is parallel to the second wiring plate; the second wiring plate is curved so as to be able to bend in an opposite direction to the extended direction of the first extended when the flexible wiring plate is provided; and a reinforcement part having a wide width is formed at both sides of the second wiring plate.

According to the above mentioned object of the present invention, rigidity of the facing part of the second wiring plate is improved so that the second wiring plate is prevented from projecting into the gap formed between the members of the movable side and the fixed side.

The above object of the present invention is also achieved by a flexible wiring plate, including a first wiring plate connected to a connector of a member of a fixed side; a second wiring plate connected to a connector of a member of a movable side; and a third wiring plate connecting the first wiring plate to the second wiring plate; wherein an extended direction of the first wiring plate is parallel to the second wiring plate; the second wiring plate is curved so as to be able to bend in an opposite direction to the extended direction of the first extended when the flexible wiring plate is provided; and a conductive pattern for reinforcement is provided at a facing part of the second wiring plate which faces a gap formed between the member of the fixed side and the member of the movable side so that a reinforcement part is formed.

According to the above mentioned object of the present invention, rigidity of the facing part of the second wiring plate is improved so that the second wiring plate is prevented from projecting into the gap formed between the members of the movable side and the fixed side.

A reinforcement film having rigidity may be formed at the reinforcement part.

According to the above object of the present invention, rigidity of the facing part of the second wiring plate is further improved so that the flexible wiring plate is prevented from projecting into the gap formed between the members of the movable side and the fixed side. Hence, the flexible wiring plate being sandwiched by the members of the movable side and the fixed side so that the member of the movable side does not move smoothly and accurately can be avoided.

The above object of the present invention is also achieved by an electronic device for recording and/or playing back information, including a tray where a recording medium is mounted; a chassis which movably supports the tray; a moving mechanism that moves the tray to a position where the recoding medium can be exchanged or installed; a record and play back part which is provided at the tray and records or plays back information on the recording medium mounted on the tray; and a flexible wiring plate connecting the record and play back part and the chassis, the flexible wiring plate comprising: a first wiring plate connected to a connector of the chassis; a second wiring plate connected to a connector of the tray; and a third wiring plate connecting the first wiring plate to the second wiring plate; wherein an extended direction of the first wiring plate is parallel to the second wiring plate; and a reinforcement part having a wide width is provided at both sides of the second wiring plate.

According to the above invention, rigidity of the facing part of the second wiring plate is improved so that the flexible wiring plate is prevented from projecting into the gap formed between the tray of movable side and the chassis of the fixed side. Hence, the flexible wiring plate being sandwiched by the tray and the chassis so that the tray does not move smoothly and accurately can be avoided.

The above object of the present invention is also achieved by an electronic device for recording and/or playing back information, including a tray where a recording medium is mounted; a chassis that movably supports the tray; a moving mechanism that moves the tray to a position where the recoding medium can be exchanged or installed; a record and play back part which is provided at the tray and records or plays back information on the recording medium mounted on the tray; and a flexible wiring plate connecting the record and play back part and the chassis, the flexible wiring plate comprising: a first wiring plate connected to a connector of the chassis; a second wiring plate connected to a connector of the tray; and a third wiring plate connecting the first wiring plate to the second wiring plate; wherein a reinforcement part having a wide width is formed at both sides of the second wiring plate.

According to the above object of the present invention, rigidity of the facing part of the second wiring plate is improved so that the second wiring plate is prevented from projecting into the gap formed between the members of the movable side and the fixed side. Hence, the second wiring plate being sandwiched by the tray and the chassis so that the tray does not move smoothly and accurately can be avoided.

The above object of the present invention is also achieved by an electronic device for recording and/or playing back information, including a tray where a recording medium is mounted; a chassis that movably supports the tray; a moving mechanism that moves the tray to a position where the recoding medium can be exchanged or installed; a record and play back part which is provided at the tray and records or plays back information to the recording medium mounted on the tray; and a flexible wiring plate connecting the record and play back part and the chassis, the flexible wiring plate comprising: a first wiring plate connected to a connector of the chassis; a second wiring plate connected to a connector of the tray; and a third wiring plate connecting the first wiring plate to the second wiring plate; wherein an extended direction of the first wiring plate is parallel to the second wiring plate; and a reinforcement part having an increased width is provided at both sides of the second wiring plate.

According to the above object of the present invention, rigidity of the facing part of the second wiring plate is improved so that the second wiring plate is prevented from projecting into the gap formed between the members of the movable side and the fixed side.

The above object of the present invention is also achieved by an electronic device for recording and/or playing back information, including a tray where a recording medium is mounted; a chassis that movably supports the tray; a moving mechanism that moves the tray to a position where the recoding medium can be exchanged or installed; a record and play back part which is provided at the tray and records or plays back information on the recording medium mounted on the tray; and a flexible wiring plate connecting the record and play back part and the chassis, the flexible wiring plate comprising: a first wiring plate connected to a connector of the chassis; a second wiring plate connected to a connector of the tray; and a third wiring plate connecting the first wiring plate to the second wiring plate; a conductive pattern for reinforcement is provided at a facing part of the second wiring plate that faces a gap formed between the chassis and the tray so that a reinforcement part is formed.

According to the above object of the present invention, rigidity of the facing part of the second wiring plate is further improved so that the flexible wiring plate is prevented from projecting into the gap formed between the tray of movable side and the chassis of the fixed side. Hence, the flexible wiring plate being sandwiched by the tray and the chassis so that the tray does not move smoothly and accurately can be avoided.

Other objects, features, and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments of the present invention.

Figure 1:
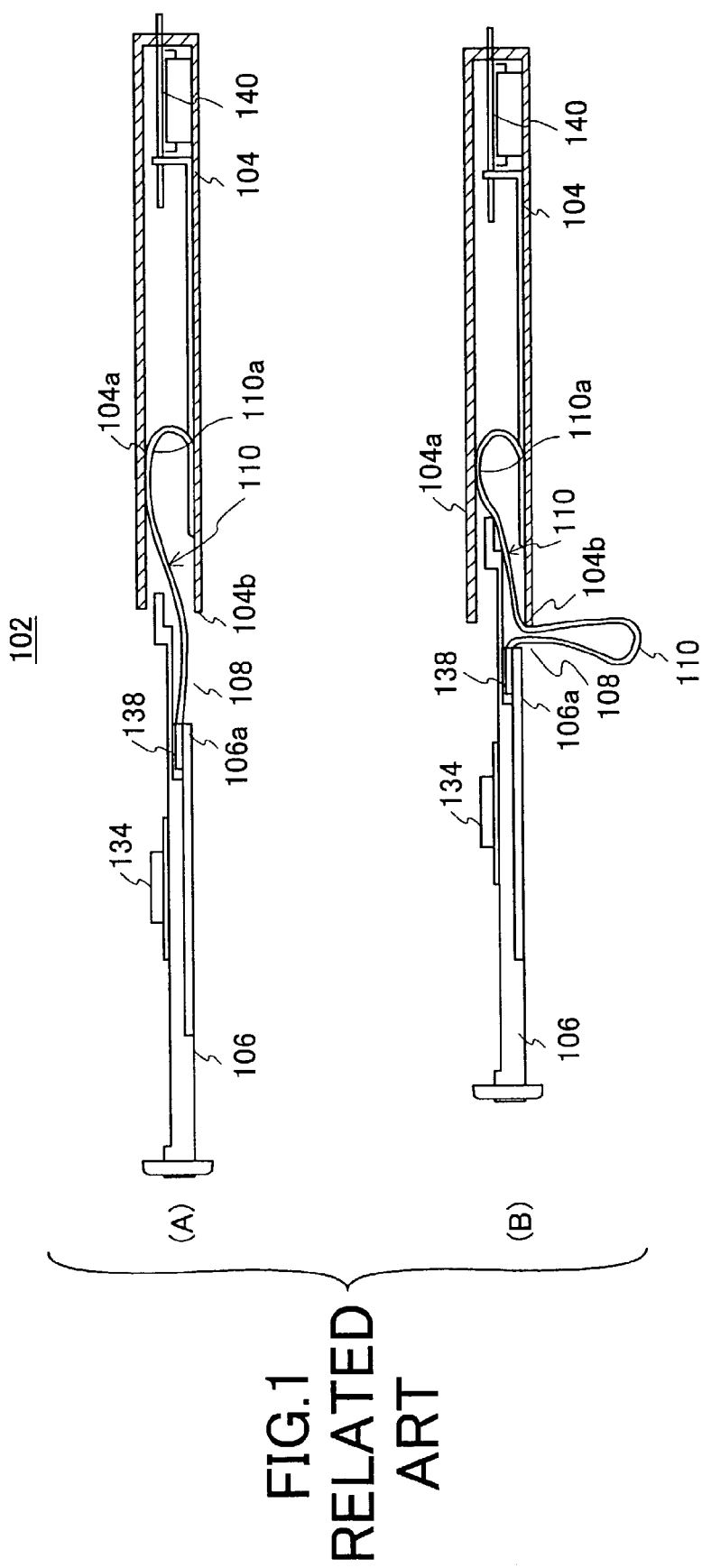
FIG. 1 is a view showing an action of the related art, more particularly FIG. 1-(A) is a sectional side view showing a state where a tray is pulled out to a position where a disk can be exchanged and FIG. 1-(B) is a sectional side view showing an action process in which the tray goes back to a position where the disk can be installed (played)
Figure 2:
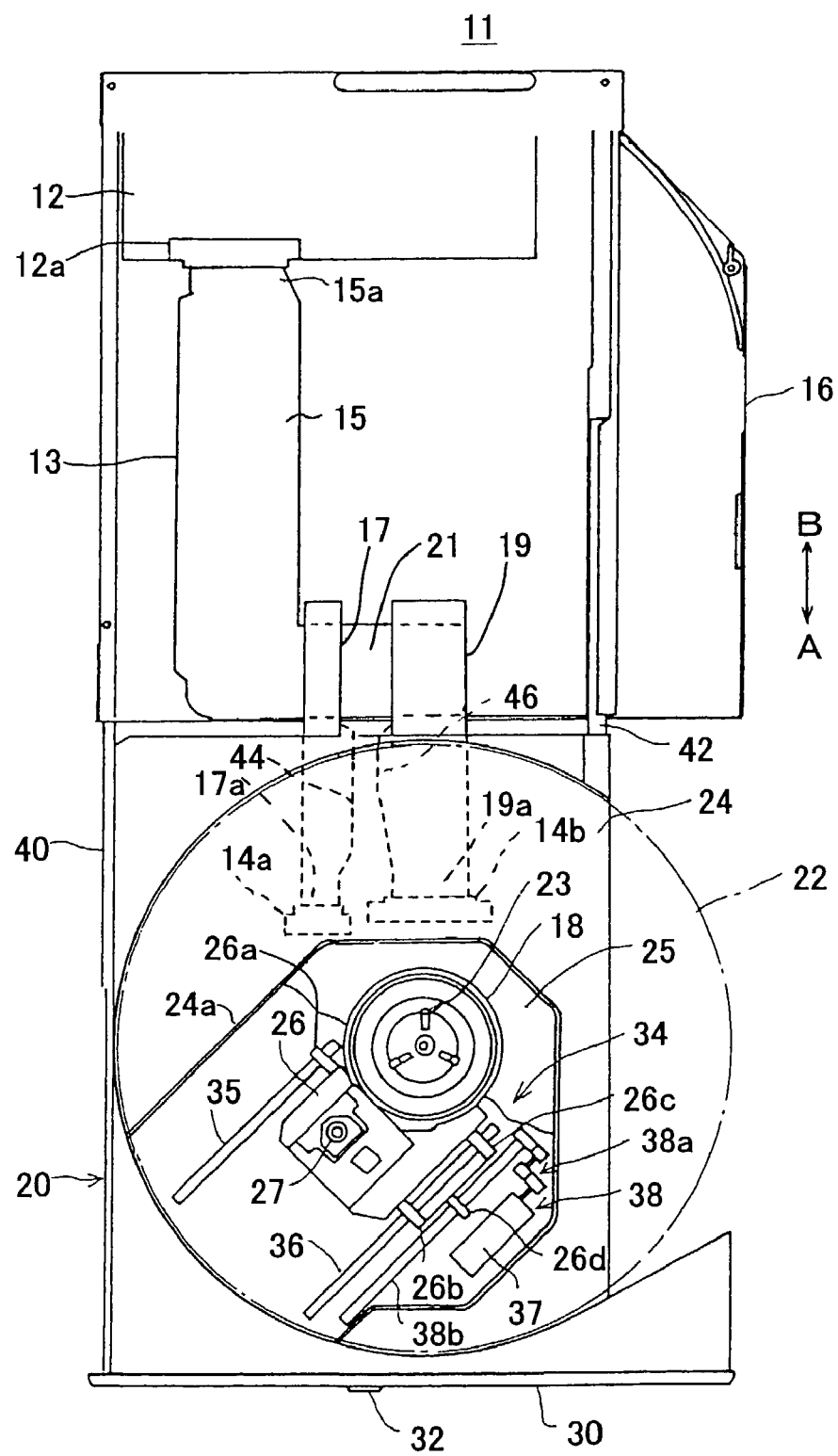
FIG. 2 is a plan view showing an embodiment of a disk device to which a flexible wiring plate of the present invention is applied.

FIG. 2 is a plan view showing an embodiment of a disk device to which a flexible wiring plate of the present invention is applied.

As shown in FIG. 2, a disk device 11 is a drive device in which a recording medium having a disk shape such as a CD-ROM, CD-R, CD-RW, DVD-ROM, DVD-RAM or the like, is provided. After an optical disk 22 is mounted on a tray 20 and the tray 20 moves in the direction of B to a position where the disk 22 can be installed, the disk device 11 starts recording or playing back information. A circuit substrate 12 provided at a chassis 16 and a substrate (not shown in FIG. 2) provided at a lower surface of the tray 20 are electrically connected by a flexible wiring plate 13.

A connector 12a to which an end part of the flexible wiring plate 13 is connected is provided at the circuit substrate 12 of the chassis 16 (a fixed side member). A connector 14a for a turn table and a connector 14b for a pick up are provided at a substrate of the tray 20 (a movable side member).

The flexible wiring plate 13 includes a first wiring plate 15 connected to the connector 12a at the fixed side, second wiring plates 17 and 19 connected to the connectors 14a and 14b at the movable side, and a third wiring plate 21 connecting the first wiring plate 15 and the second wiring plates 17 and 19.

Furthermore, the second wiring plates 17 and 19 are bent so as to extend in an opposite direction (direction of A) to an extending direction of the first wiring plate 15 (direction of B). Therefore, portions pulled out from the third wiring plate 21 of the second wiring plates 17 and 19 are bent so as to form a U shape. The above mentioned curved parts 17a and 19a move as corresponding to a sliding movement of the tray 20.

The tray 20 includes a turn table 18 and an optical pick up 26. The turn table 18 clamps and rotate-drives the optical disk 22. The optical pick up 26 is provided movably in a radial direction of the optical disk 22. The optical pick up 26 records information to the optical disk 22 and reads out the information recorded in the optical disk 22 optically.

The tray 20 is supported so as to be capable of sliding in directions of A and B against the chassis 16 by guide rail mechanisms 40 and 42. Because of this, the tray 20 can be moved manually to the positions where the disk is exchanged or installed.

Figure 3:
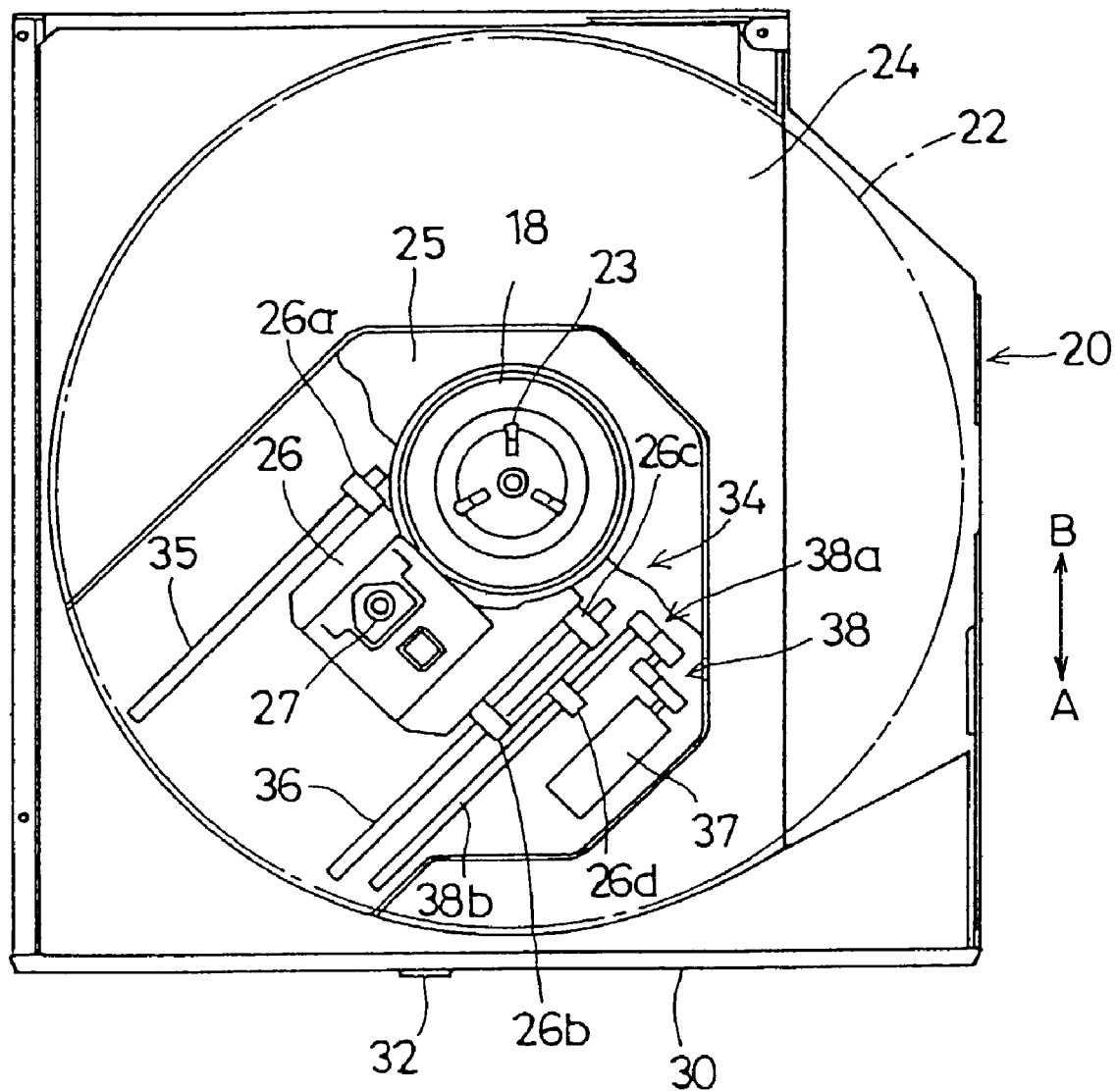
FIG. 3 is a plan view showing a state where a tray is inserted to a position where the disk can be installed.
Figure 4:
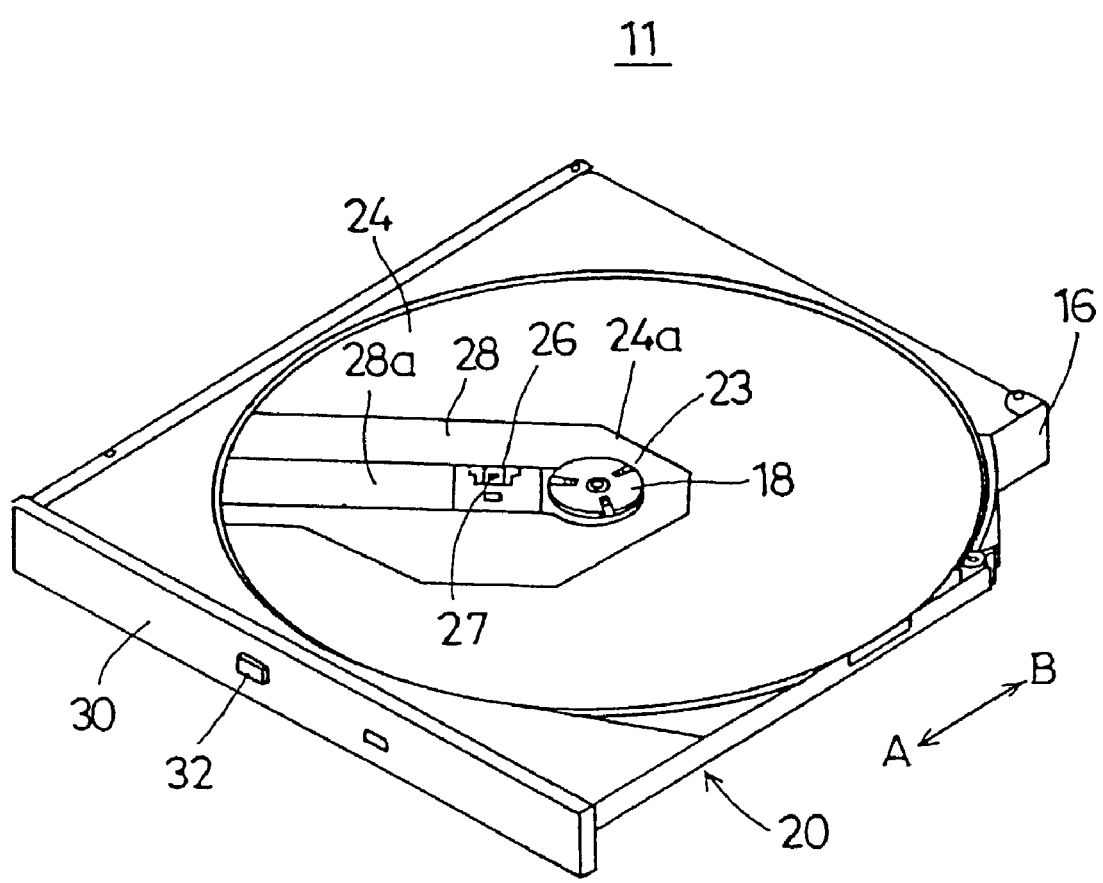
FIG. 4 is a perspective view showing a state where the tray is inserted to the position where the disk can be installed.

FIG. 3 is a plan view showing a state where a tray is inserted to a position where the disk can be exchanged. FIG. 4 is a perspective view showing a state where the tray is inserted to the position where the disk can be exchanged.

Referring to FIGS. 2 and 3, a disk device 11 includes a tray 20. A turn table 18 is provided at a center of the tray 20. The turn table 18 has a clamp mechanism 23 clamping a disk 22 so as to engage with the inner circumference of the disk 22. A disk storage part 24 having a diameter bigger than that of the disk 22, is provided around the turn table 18.

An optical pick up 26 is provided below the disk storage part 24 as the optical pick up 26 can move in a disk-radial direction. Information that is recorded in the disk 22 clamped by the clamp mechanism 23 of the turn table 18 is read out by the optical pick up 26. The optical pick up 26 is stored at a concave part 24a of the disk storage part 24. The concave part 24a is covered with a pick up cover 28 having a opening part 28a in a movable range of an objective lens 27 of the optical pick up 26. A front side bezel 30 connected to the front side of the tray 20 is equipped with an eject button 32 in the center of the front side bezel 30.

The turn table 18 and the disk 22 clamped by the clamp mechanism 23 of the turn table 18 rotate as a disk driving motor (not shown in FIGS. 2 and 3) rotates.

As shown in FIG. 2, if an eject button 32 on the front slide bezel 30 is operated by pushing, the lock of the tray 20 is unlocked with a lock mechanism (not shown in FIG. 2) provided on the chassis 16. The tray 20 whose lock is unlocked can slide in the A direction and be pulled out to the position where the disk can be exchanged by manual operation.

After the disk 22 is clamped at the turn table 18 of the tray 20 which is pulled out to the position where the disk can be exchanged, the tray 20 is moved in the B direction by pushing the front bezel 30 in the B direction and locked at the position where the disk can be installed as shown in FIGS. 3 and 4 with the lock mechanism (not shown in FIG. 2) provided on the chassis 16.

Referring to FIGS. 3 and 4, a pick up driving mechanism 34 includes a pair of guide shafts 35 and 36 guiding the moving direction of the optical pick up 26, a driving motor 37 driving the optical pick up 26, a transmission mechanism 38 transmitting the rotational driving force of the driving motor 37 to the optical pick up 26.

Bearing parts 26*a* through 26*c*, engaged with the pair of guide shafts 35 and 36 so that the moving direction is guided, project at both sides of the optical pick up 26. The transmission mechanism 38 includes a gear group 38*a* that reduces the speed of rotation of the driving motor 37, and a lead screw 38*b* rotationally driven with the gear group 38*a*. The optical pick up 26 includes an engaging part 26*d* that engages with the spiral groove of the lead screw 38*b*.

Therefore, the optical pick up 26 moves in a radial direction of the disk by the transmitting of the rotation of the driving motor 37 to the lead screw 38*b* through the gear group 38*a*.

Figure 5:
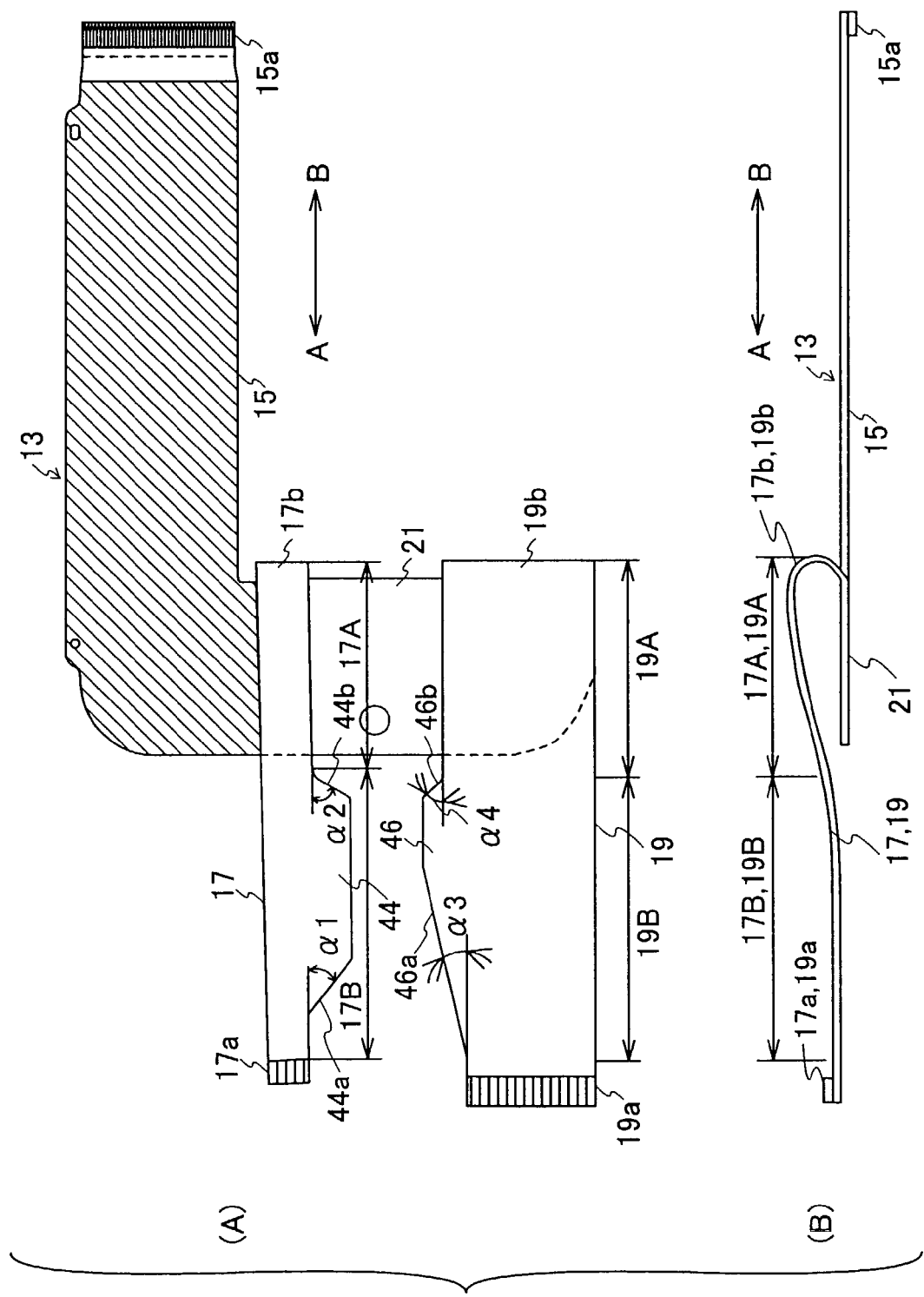
FIG. 5-(A) is an enlarged plan view showing an exchange state of a flexible wiring plate 13 and FIG. 5-(B) is an enlarged side view showing the exchange state of the flexible wiring plate 13.
Figure 6:
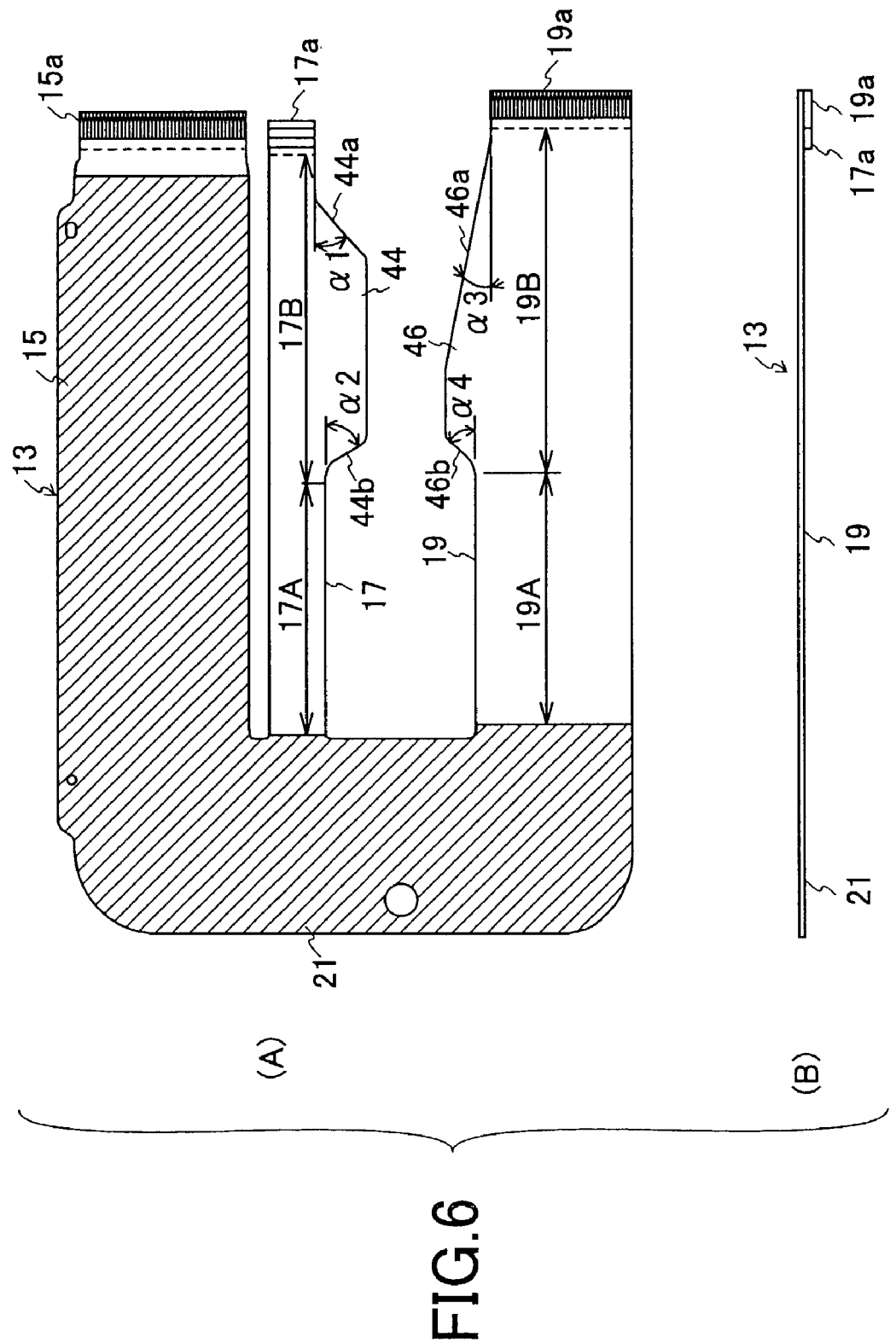
FIG. 6-(A) is an enlarged plan view showing the flexible wiring plate 13 prior to being installed and FIG. 5-(B) is a side view enlarged-showing the flexible wiring plate 13 prior to being installed.

Here, details of the flexible wiring plate 13 will be described. FIG. 5-(A) is an enlarged plan view showing the exchange state of the flexible wiring plate 13 and FIG. 5-(B) is an enlarged side view showing the exchange state of the flexible wiring plate 13. FIG. 6-(A) is an enlarged plan view showing the installation state of the flexible wiring plate 13 prior to being installed and FIG. 6-(B) is an enlarged side view showing the installation state of the flexible wiring plate 13 prior to being installed.

As shown in FIGS. 5-(A), 5-(B), 6-(A) and 6-(B), the flexible wiring plate 13 includes a first wiring plate 15, second wiring plates 17 and 19, and a third wiring plate 21. The first wiring plate 15 is formed so as to extend in a direction of B. The second wiring plates 17 and 19 are bent in an opposite direction (direction of A) to the extending direction of the first wiring plate 15 (direction of B). The third wiring plate 21 is formed so as to extend in a perpendicular direction to the first wiring plate 15 and the second wiring plates 17 and 19. The first wiring plate 15 and the third wiring plate 21 are bonded so as to be stuck to the upper surface of the chassis 16.

The first wiring plate 15 is provided along the chassis 16. The first wiring plate 15 has an end part where a terminal 15*a* connecting to the connector 12*a* at the fixed side is provided. The second wiring plates 17 and 19 are formed so as to extend from the third wiring plate 21 in a direction of B that is parallel to the direction of the first wiring plate 15. During the assembling process, the second wiring plates 17 and 19 are curved 180 degrees as shown in FIG. 5(B), so that terminals 17*a* and 19*a* connecting to connectors 14*a* and 14*b*, respectively, are provided at head ends of the second wiring plates 17 and 19.

Curved parts 17*b* and 19*b* of the second wiring plates 17 and 19 are bent and have a radius of curvature so as to be received between the chassis 16 and a ceiling plate (not shown). The second wiring plates 17 and 19 are divided into first sections 17A and 19A and second sections 17B and 19B, respectively, in a state where the tray 20 is pulled out to the position where the disk can be exchanged. The first sections 17A and 19A are sections for curved parts 17*b* and 19*b*. The second sections 17B and 19B are sections formed between the curved parts 17*b* and 19*b* and the terminals 17*a* and 19*a*, respectively.

Reinforcement parts 44 and 46, which project in a width direction, are provided at a side of the second sections 17B and 19B, respectively. The reinforcement parts 44 and 46 project with trapezoid shapes as seen in the plan view, as shown in FIG. 6-(A). The reinforcement parts 44 and 46 improve the rigidities of the second sections 17B and 19B by by increasing surface areas of the second sections 17B and 19B.

Figure 7:
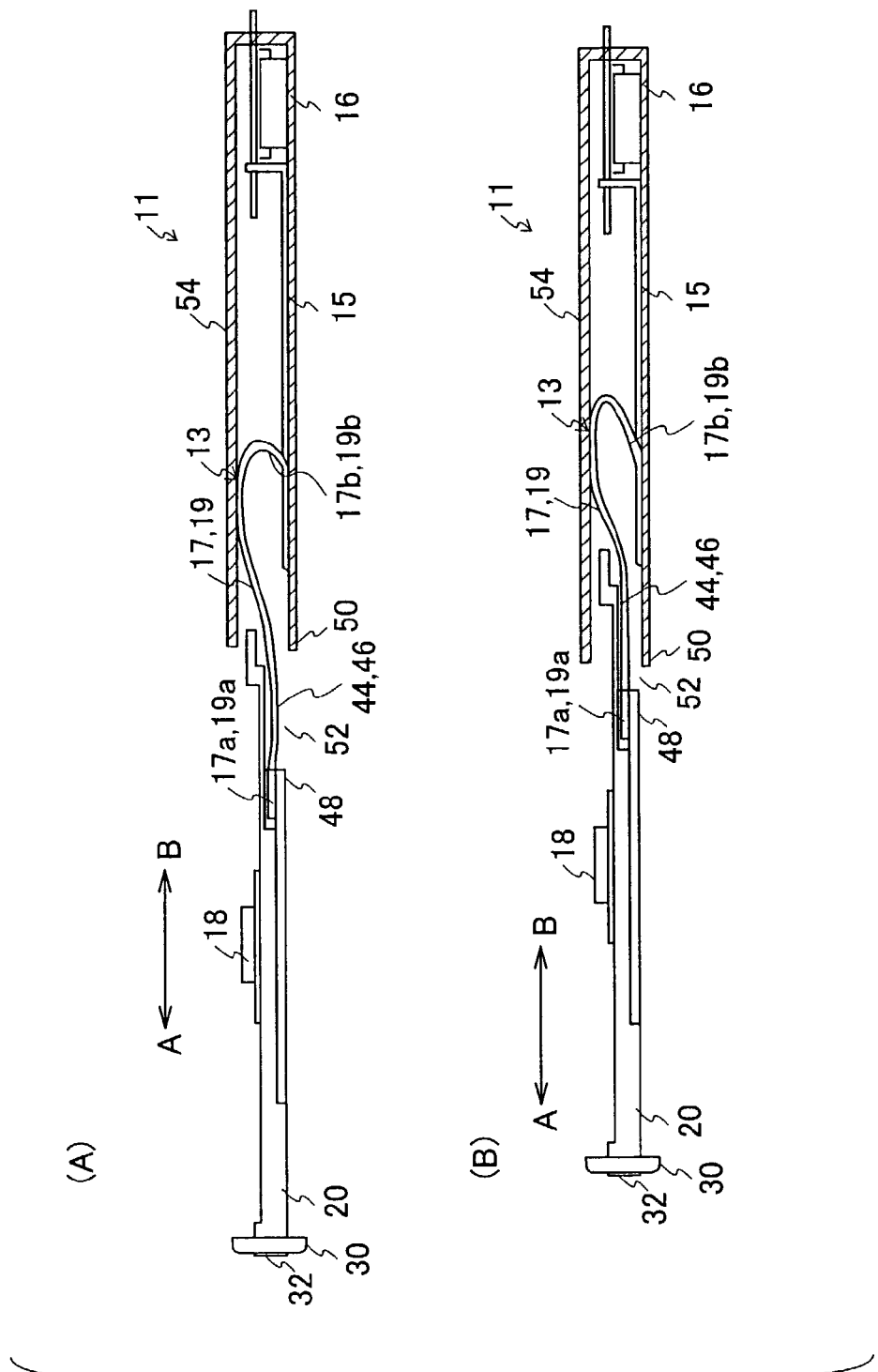
FIG. 7 is a view showing an action of the tray 20 and the flexible wiring plate 13, more particularly FIG. 7-(A) is a sectional side view showing a state where the tray 20 is pulled out to a position where a disk can be exchanged and FIG. 7-(B) is a sectional side view showing an action process in which the tray 20 moves toward a position where the disk can be installed.

FIG. 7 is a view showing an action of the tray 20 and the flexible wiring plate 13, more particularly FIG. 7-(A) is a sectional side view showing a state where the tray 20 is pulled out to a position where a disk can be exchanged and FIG. 7-(B) is a sectional side view showing an action process in which the tray 20 is partially moved back toward a position where the disk can be installed.

As shown in FIGS. 7-(A) and 7-(B), the second sections 17B and 19B face a gap 52 formed between a rear end part 48 of the tray 20 and a front end part 50 of the chassis 16 when the tray 20 is pulled out to the position where the disk can be exchanged. Both ends of the reinforcement parts 44 and 46 have inclined parts 44*a*, 44*b*, and 46*a*, 46*b* that are inclined at designated angles (a1 through a4) against directions of A and B, respectively. The inclined parts 44*a*, 44*b*, 46*a*, and 46*b* prevent the reinforcement parts 44 and 46 from being caught by the rear end part 48 of the tray 20 or the front end part 50 of the chassis 16 when the tray 20 slide in directions of A and B so that the reinforcement parts 44 and 46 slide and come in contact with the rear end part 48 and the front end part 50.

When the tray 20 is slid in directions of A and B, the curved parts 17*b* and 19*b* move in directions of A and B, respectively, in a state where the curved parts 17*b* and 19*b* come in contact with the ceiling plate 54. When the curved parts 17*b* and 19*b* stop moving due to friction with the ceiling plate 54, force pushing down the second sections 17B and 19B is applied. However, since the second sections 17B and 19B are reinforced by the reinforcement parts 44 and 46, the second sections 17B and 19B have higher rigidities than the first sections 17A and 19A.

Accordingly, in a case where the curved parts 17*b* and 19*b* do not move due to the frictional resistance with the ceiling plate 54 during a process where the tray 20 is slid to the position where disk can be exchanged, it is possible to overcome the frictional resistance and move the curved parts 17*b* and 19*b* by a pushing force from the second sections 17B and 19B. Therefore, it is possible to prevent the second sections 17B and 19B from projecting from the gap 52 between the rear end part 48 of the tray 20 and the front end part 50 of the chassis 16.

Thus, the flexible wiring plate 13 does not project from the gap 52 when the tray 20 is moved, so that it is possible to implement an install action of the tray 20 smoothly and accurately.

Furthermore, projection configurations of the reinforcement parts 44 and 46 are not limited to the above mentioned trapezoid shapes, but other configurations such as a semi-round shape, a semi-elliptical shape, or the like may be made.

Next, a modified example of the flexible wiring plate 13 will be explained.

Figure 8:
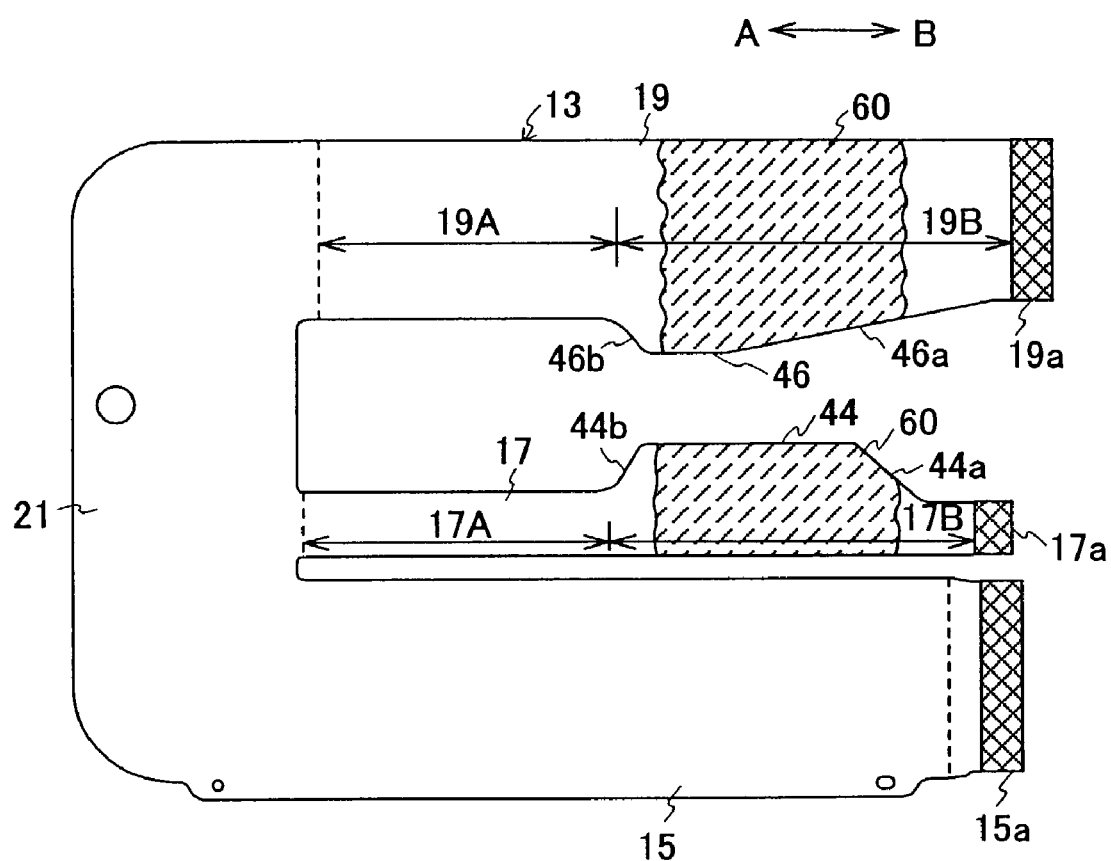
FIG. 8 is a plan view showing a modified example 1 of the flexible wiring plate 13.

FIG. 8 is a plan view showing a modified example 1 of the flexible wiring plate 13. In FIG. 8, parts that are the same as the parts of the embodiment explained the above are given the same reference numerals, and explanation thereof will be omitted.

As shown in FIG. 8, a flexible wiring plate of the modified example 1 has second sections 17B and 19B where the reinforcement parts 44 and 46 are provided. A reinforcement film 60 (shown as an area hatched by dotted lines in FIG. 8) is formed as a coat at back surfaces of the second sections 17B and 19B by a silk screen printing method. The reinforcement film 60 is made by applying a paint having higher rigidity than the material of the flexible wiring plate 13.

Thus, the reinforcement film 60 is coated at the back surfaces of the second sections 17B and 19B of the flexible wiring plate 13A of the modified example 1, and thereby the rigidity of the flexible wiring plate 13A of the modified example 1 is improved. Accordingly, it is possible to prevent the second sections 17B and 19B from projecting from the gap 52 between the rear end part 48 of the tray 20 and the front end part 50 of the chassis 16.

A resin material such as polyimide, polyester, polyurethane, acrylic, or the like can be used as the material of an insulation layer of the flexible wiring plate 13. However, it is preferable that the material of the insulation layer of the flexible wiring plate 13 is selected with consideration of temperatures for using the disk device 11 and manufacturing cost or the like.

Furthermore, in this embodiment, the reinforcement film 60 is formed by printing the paint at the back surface of the second sections 17B and 19B of the flexible wiring plate 13 with a silk screen printing. However, depending on the material of the paint or the structure of the ceiling plate 54, the silk screen printing may be implemented on the both back and front surfaces or either back or front surfaces. In addition, a method other than the silk screen printing of the paint can be used in order to improve the rigidities of the second sections 17B and 19B of the flexible wiring plate 13.

Figure 9:
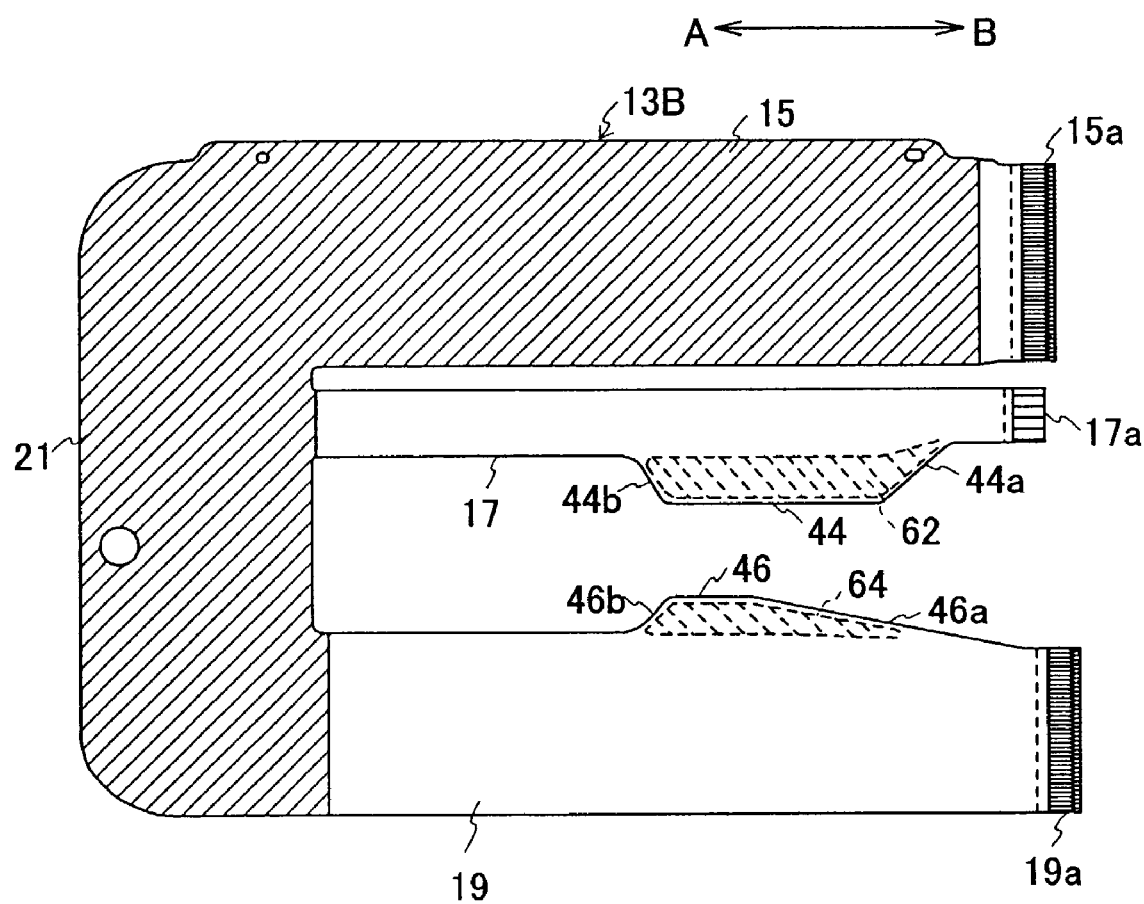
FIG. 9 is a plan view showing a modified example 2 of the flexible wiring plate 13.

FIG. 9 is a plan view showing a modified example 2 of the flexible wiring plate 13. In FIG. 9, parts that are the same as the parts of the embodiment explained the above are given the same reference numerals, and explanation thereof will be omitted.

As shown in FIG. 9, the flexible wiring plate 13B of the modified example 2 has a structure in which conductive patterns 62 and 64 for reinforcement are formed inside of the reinforcement parts 44 and 46, respectively, when other circuit patterns (not shown in FIG. 9) are formed, and the conductive patterns 62 and 64 for reinforcement are coated by an insulation layer.

Although the conductive patterns 62 and 64 for reinforcement are formed by a copper foil the same as normal circuit patterns, the conductive patterns 62 and 64 for reinforcement have a wider width and a bigger area than other circuit patterns. Hence, the conductive patterns 62 and 64 for reinforcement have improved rigidities.

Thus, in the modified example 2, the conductive patterns 62 and 64 for reinforcement are formed inside of the reinforcement parts 44 and 46 so that the rigidity of the flexible wiring plate 13B of the modified example 2 is improved. Accordingly, it is possible to prevent the second sections 17B and 19B from projecting from the gap 52 between the rear end part 48 of the tray 20 and the front end part 50 of the chassis 16.

Here, in the modified example 2, configurations and materials of the conductive patterns 62 and 64 for reinforcement are not limited to the above mentioned ones.

Figure 10:
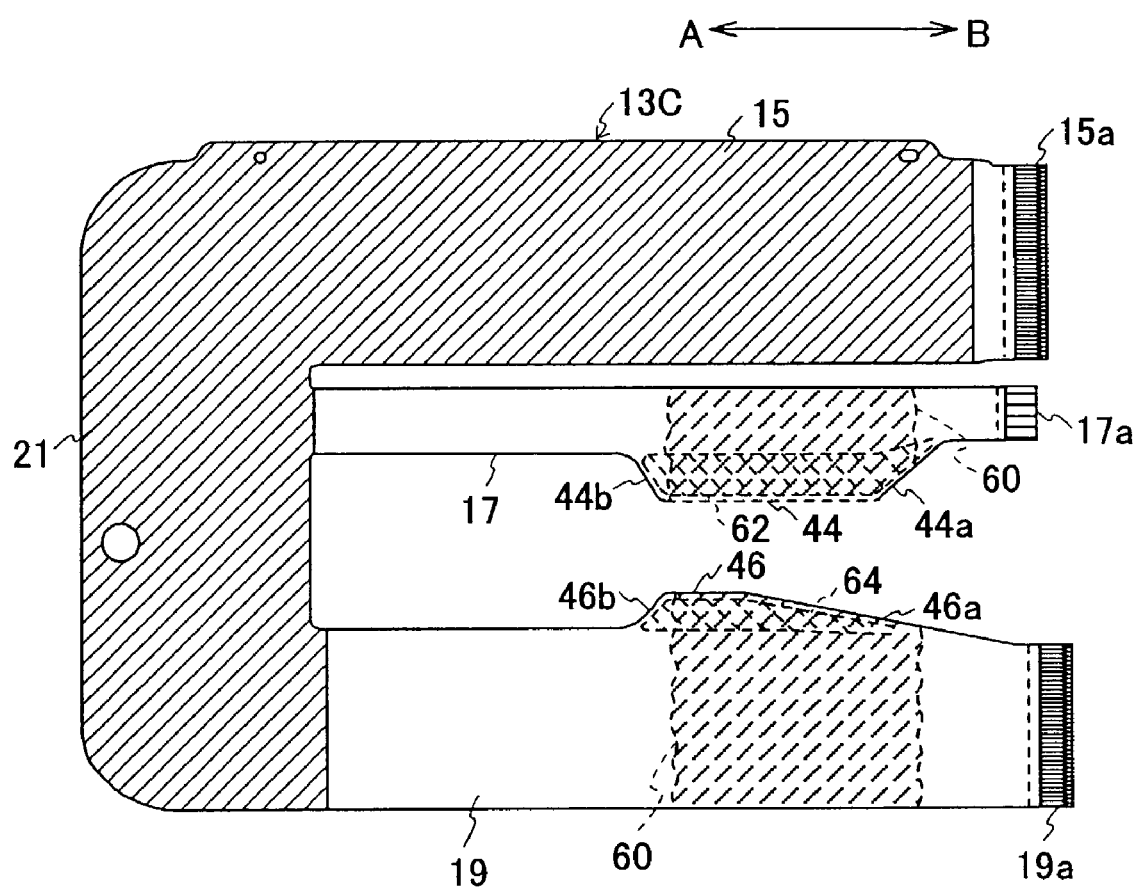
FIG. 10 is a plan view showing a modified example 3 of the flexible wiring plate 13.

FIG. 10 is a plan view showing a modified example 3 of the flexible wiring plate 13. In FIG. 10, parts that are the same as the parts of the embodiment explained in the above are given the same reference numerals, and explanation thereof will be omitted.

As shown in FIG. 10, a flexible wiring plate 13C of the modified example 3 has second sections 17B and 19B where the reinforcement parts 44 and 46 are provided. A reinforcement film 60 (shown as an area hatched by broken lines in FIG. 10) is formed at a back surface of the second sections 17B and 19B by a silk screen printing method.

Furthermore, the flexible wiring plate 13C of the modified example 3 has a structure in which conductive patterns 62 and 64 for reinforcement are formed inside of the reinforcement parts 44 and 46, respectively, when other circuit patterns (not shown in FIG. 10) are formed, and the conductive patterns 62 and 64 for reinforcement are coated by an insulation layer.

Thus, in the third modified example, the reinforcement film 60 is coated at the back surface of the second sections 17B and 19B, and thereby the rigidity of the flexible wiring plate 13C of the modified example 3 is improved. Furthermore, the conductive patterns 62 and 64 for reinforcement are formed inside of the reinforcement parts 44 and 46, and thereby the rigidity of the flexible wiring plate 13C of the modified example 3 is improved. Accordingly, it is possible to accurately prevent the second sections 17B and 19B from projecting from the gap 52 between the rear end part 48 of the tray 20 and the front end part 50 of the chassis 16.

Figure 11:
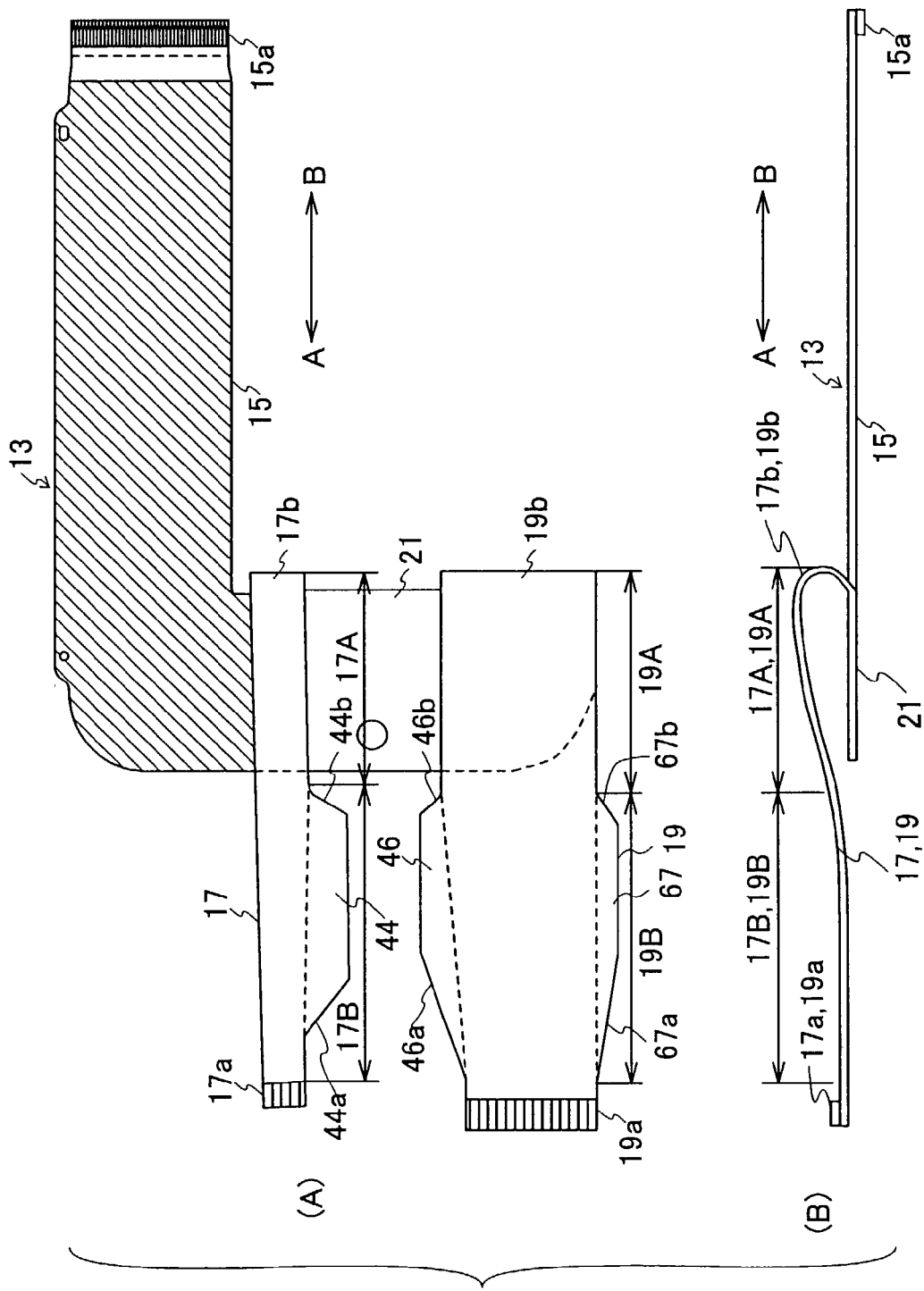
FIG. 11-(A) is an enlarged plan view showing an exchange state of a modified example 4 of the flexible wiring plate 13 and FIG. 11-(B) is an enlarged side view showing the exchange state of the modified example 4 of the flexible wiring plate 13.
Figure 12:
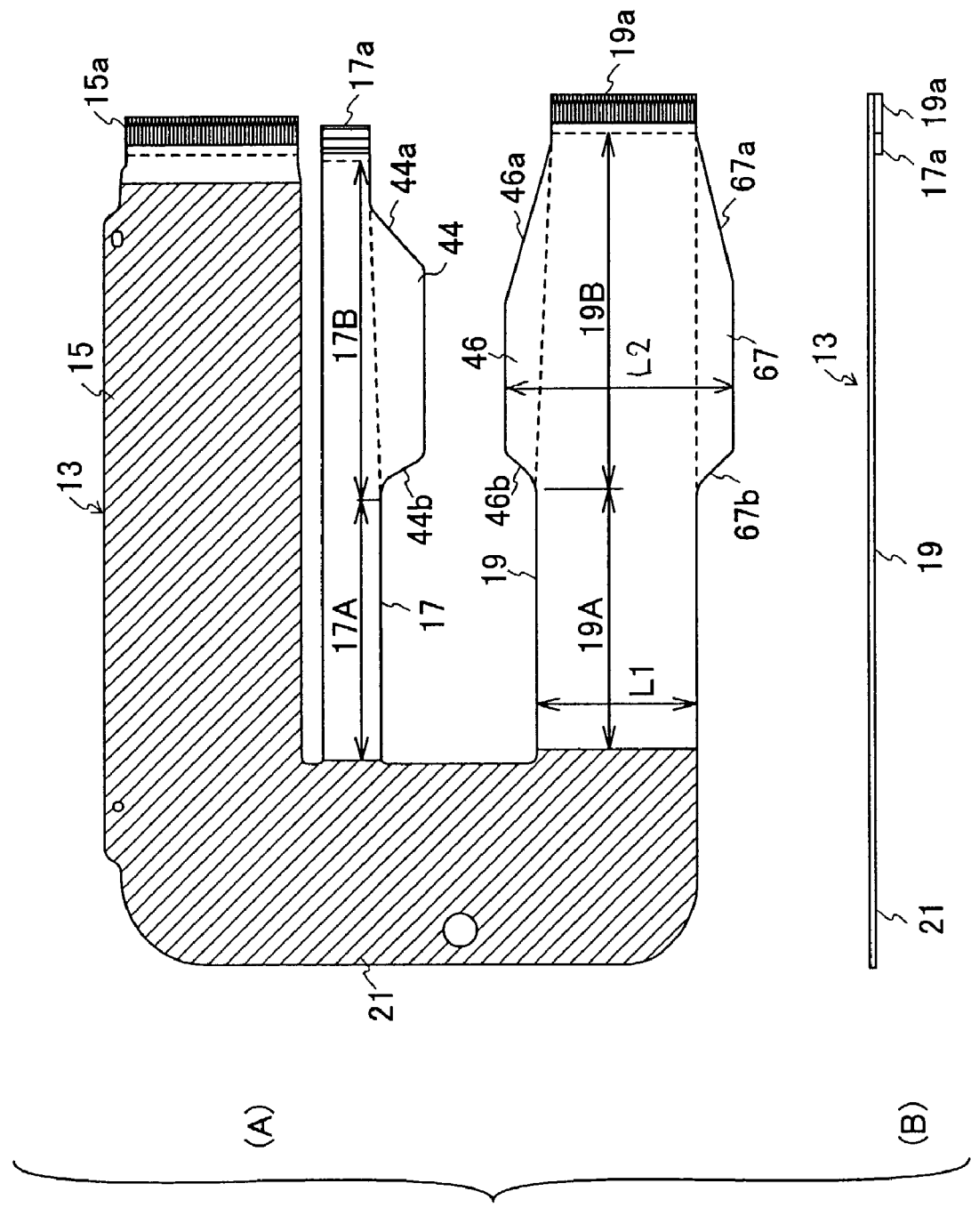
FIG. 12-(A) is an enlarged plan view showing a modified example 4 of the flexible wiring plate 13 prior to being installed and FIG. 12-(B) is an enlarged side view showing the modified example 4 of the flexible wiring plate 13 prior to being installed.

FIG. 11-(A) is an enlarged plan view showing an exchange state of a modified example 4 of the flexible wiring plate 13 and FIG. 11-(B) is an enlarged side view showing the exchange state of the modified example 4 of the flexible wiring plate 13. FIG. 12-(A) is an enlarged plan view showing the installation state where a modified example 4 of the flexible wiring plate 13 prior to being installed and FIG. 12-(B) is an enlarged side view showing the installation state where the modified example 4 of the flexible wiring plate 13 prior to being installed. In FIGS. 11 and 12, parts that are the same as the parts shown in FIGS. 5 and 6 explained the above are given the same reference numerals, and explanation thereof will be omitted.

As shown in FIGS. 11 and 12, the flexible wiring plate 13 of the modified example 4 has a structure in which reinforcement parts 44, 46, and 67 are provided at side parts of the second sections 17B and 19B of the second wiring plates 17 and 19 so as to project in width directions.

The reinforcement part 67 projects to the other side of the second wiring plate 19 so as to be symmetric against the reinforcement part 46 provided at one side of the second wiring plate 19. The reinforcement part 67 has inclination parts 67a and 67b as well as the reinforcement part 46.

Since the reinforcement parts 46 and 67 project at both sides of the second section 19B of the second wiring plate 19, a width L2 of the conductive pattern of the second section 19B is wider than a width L1 of the conductive pattern of the first section 19A (L2>L1). Therefore, as shown in FIG. 12-(A), the reinforcement parts 44, 46, and 67 project as having a trapezoid shape seen in a plan view. Hence, the rigidity of the second wiring plate 19 is improved by increasing areas of the second sections 17B and 19B.

Therefore, since the rigidity of the second wiring plate 19 is further improved by providing the reinforcement parts 46 and 67 at both sides of the second section 19B, it is possible to prevent the second section 19B from projecting from the gap 52 between the rear end part 48 of the tray 20 and the front end part 50 of the chassis 16. The reinforcement film 60 (shown as an area hatched by dotted lines in FIG. 8) may be formed by coating at the flexible wiring plate 13 by the above mentioned silk screen printing method.

Figure 13:
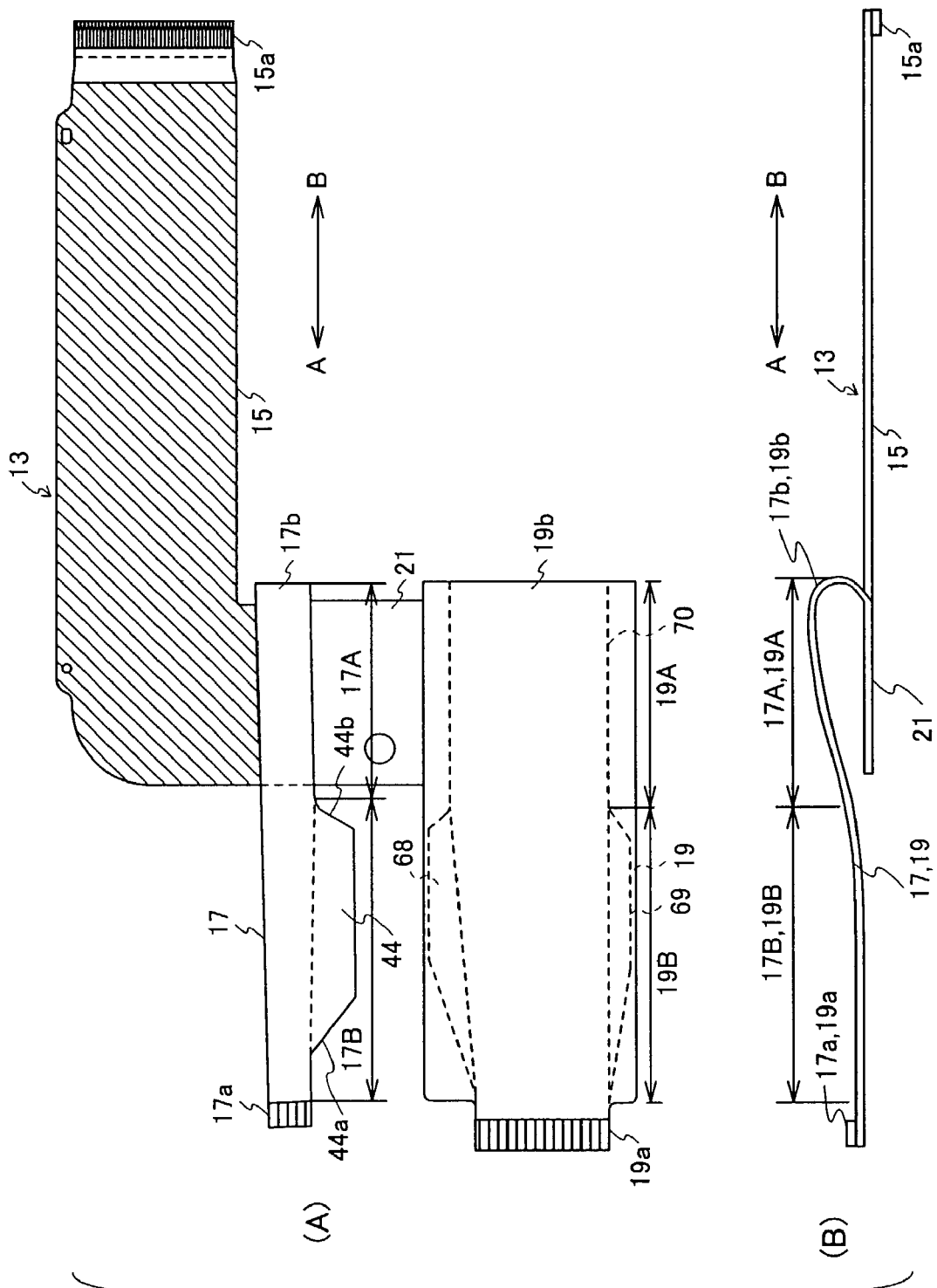
FIG. 13-(A) is an enlarged plan view showing an exchange state of a modified example 5 of the flexible wiring plate 13 and FIG. 13-(B) is an enlarged side view showing the exchange state of the modified example 5 of the flexible wiring plate 13.
Figure 14:
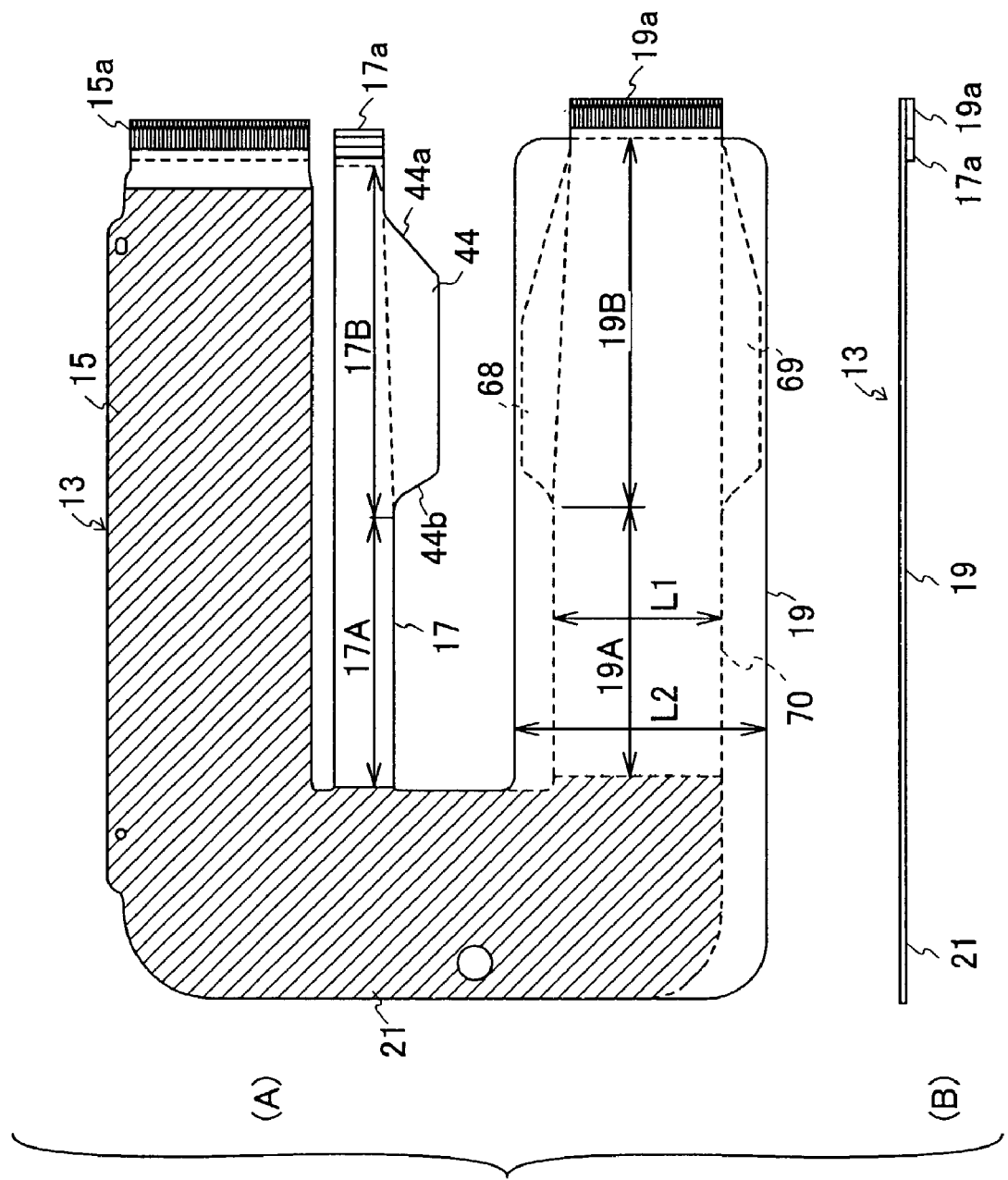
FIG. 14-(A) is an enlarged plan view showing a modified example 5 of the flexible wiring plate 13 prior to being installed and FIG. 14-(B) is an enlarged side view showing the modified example 5 of the flexible wiring plate 13 prior to being installed.

FIG. 13-(A) is an enlarged plan view showing an exchange state of a modified example 5 of the flexible wiring plate 13 and FIG. 13-(B) is an enlarged side view showing the exchange state of the modified example 5 of the flexible wiring plate 13. FIG. 14-(A) is an enlarged plan view showing the installation state where a modified example 5 of the flexible wiring plate 13 prior to being installed and FIG. 14-(B) is an enlarged side view showing the installation state where the modified example 5 of the flexible wiring plate 13 prior to being installed. In FIGS. 13 and 14, parts that are the same as the parts shown in FIGS. 5 and 6 explained the above are given the same reference numerals, and explanation thereof will be omitted.

As shown in FIGS. 13 and 14, the flexible wiring plate 13 of the modified example 5 has a structure in which a conductive pattern 70 connected to the terminal 19a is formed at the second wiring plate 19. Conductive patterns 68 and 69 for reinforcement (shown as areas by broken lines in FIGS. 13 and 14) which project in a width direction are provided at both sides of a range corresponding to the second section 19B of the conductive pattern 70.

In the second wiring plate 19, the conductive patterns 68 and 69 for reinforcement having increased width configurations are formed at both sides of the conductive pattern 70. Therefore, a width L2 of the second section 19B is wider than a width L1 of the first section 19A (L2>L1) Hence, the conductive patterns 68 and 69 for reinforcement increase the rigidity of the second section 19B by increasing the conductive pattern area of the second section 19B.

The width of the conductive pattern 70 is substantially same as the width L1 of the second wiring plate 19 shown in FIG. 11. The width of the conductive pattern 70 plus the widths of the conductive patterns 68 and 69 substantially equals the width L2 of the second wiring plate 19.

Thus, in the fifth embodiment, the conductive patterns 68 and 69 for reinforcement are provided at both sides of a range corresponding to the second section 19B of the conductive pattern 70. Therefore, the rigidity is further improved so that it is possible to prevent the second section 19B from projecting from the gap 52 between the rear end part 48 of the tray 20 and the front end part 50 of the chassis 16. Hence, the flexible wiring plate 13 does not have to have a structure in which the reinforcement film 60 (shown as areas hatched by dotted lines in FIG. 8) is formed by coating at the back surface by the above mentioned silk screen printing method.

The above mentioned conductive patterns 68 and 69 for reinforcement may be provided separately from the other circuits (signal lines) or with the other circuits (signal lines) in a body.

The present invention is not limited to these embodiments, but various variations and modifications such as a disk device not including a tray may be made without departing from the scope of the present invention. Although the disk device including the drive device in which a recording medium such as a CD-ROM, CD-R, CD-RW, DVD-ROM, DVD-RAM or the like is provided, is described in the above mentioned embodiments, the present invention can be applied to other kinds of electronic devices for recording and/or playing back information which have a flexible wiring plate which is provided so as to curve and connect a fixed side and a movable side, so that the curved part moves as corresponding to movement of the moveable side.

The patent application is based on Japanese priority patent applications No. 2001-267760 filed on Sep. 4, 2001 and No. 2002-105678 filed on Apr. 8, 2002, the entire contents of which are hereby incorporated by reference.

What is claimed is:

1. An electronic device for recording and/or playing back information, comprising:
   a tray where a recording medium is mounted;
   a chassis that movably supports the tray;
   a moving mechanism that moves the tray to a position where the recoding medium is exchanged or installed;
   a record and play back part that is provided at the tray and records or plays back information on the recording medium mounted on the tray; and
   a flexible wiring plate connecting the record and play back part and the chassis,
   the flexible wiring plate comprising:
   a first wiring plate connected to a connector of the chassis;
   a second wiring plate connected to a connector of the tray; and
   a third wiring plate connecting the first wiring plate to the second wiring plate,
   wherein the first wiring plate is disposed in a direction parallel to the second wiring plate; and
   wherein the second wiring plate includes a reinforcement part having an increased width extending from the second wiring plate in a direction perpendicular to the width direction of the second wiring plate.

2. The electronic device for recording and/or playing back information as claimed in claim 1, wherein a reinforcement film having rigidity is formed at the reinforcement part.

3. An electronic device for recording and/or playing back information, comprising:
   a tray where a recording medium is mounted;
   a chassis that movably supports the tray;
   a moving mechanism that moves the tray to a position where the recoding medium is exchanged or installed;
   a record and play back part which is provided at the tray and records or plays back information to the recording medium mounted on the tray; and
   a flexible wiring plate connecting the record and play back part and the chassis,
   the flexible wiring plate comprising:
   a first wiring plate connected to a connector of the chassis;
   a second wiring plate connected to a connector of the tray; and
   a third wiring plate connecting the first wiring plate to the second wiring plate,
   wherein the first wiring plate is disposed in a direction parallel to the second wiring plate; and
   wherein the second wiring plate includes a reinforcement part having an increased width extending from a part of the second wiring plate facing a gap formed between the chassis and the tray in a direction perpendicular to the width direction of the second wiring plate.

4. The electronic device for recording and/or playing back information as claimed in claim 3, wherein a reinforcement film having rigidity is formed at the reinforcement part.

5. An electronic device for recording and/or playing back information, comprising:
   a tray where a recording medium is mounted;
   a chassis that movably supports the tray;
   a moving mechanism that moves the tray to a position where the recoding medium is exchanged or installed;
   a record and play back part which is provided at the tray and records or plays back information to the recording medium mounted on the tray; and a flexible wiring plate connecting the record and play back part and the chassis,
the flexible wiring plate comprising:
a first wiring plate connected to a connector of the chassis;
a second wiring plate connected to a connector of the tray; and
a third wiring plate connecting the first wiring plate to the second wiring plate,
wherein the first wiring plate is disposed parallel to the second wiring plate; and
wherein said flexible wiring plate has a conductive pattern for reinforcement formed on a part of the second wiring plate that faces a gap formed between the chassis and the tray and lies in a direction perpendicular to the width direction of the second wiring plate.

6. The electronic device for recording and/or playing back information as claimed in claim 5, wherein a reinforcement film having rigidity is formed at the reinforcement part.

* * * * *